United States Patent
Prabhu et al.

(10) Patent No.: US 12,045,553 B2
(45) Date of Patent: Jul. 23, 2024

(54) METHOD FOR IMPLEMENTING AN INTEGRATED CIRCUIT COMPRISING A RANDOM-ACCESS MEMORY-IN-LOGIC

(71) Applicant: XENERGIC AB, Lund (SE)

(72) Inventors: Hemanth Prabhu, Lund (SE); Babak Mohammadi, Lund (SE)

(73) Assignee: XENERGIC AB (SE)

( * ) Notice: Subject to any disclaimer, the term of this patent is extended or adjusted under 35 U.S.C. 154(b) by 499 days.

(21) Appl. No.: 17/438,795

(22) PCT Filed: Mar. 13, 2020

(86) PCT No.: PCT/EP2020/056904
§ 371 (c)(1),
(2) Date: Sep. 13, 2021

(87) PCT Pub. No.: WO2020/182998
PCT Pub. Date: Sep. 17, 2020

(65) Prior Publication Data
US 2022/0147683 A1    May 12, 2022

(30) Foreign Application Priority Data
Mar. 14, 2019   (EP) .................... 19162811

(51) Int. Cl.
*G06F 30/392* (2020.01)
*G06F 30/394* (2020.01)
(Continued)

(52) U.S. Cl.
CPC .......... *G06F 30/392* (2020.01); *G06F 30/394* (2020.01); *G06F 30/396* (2020.01); *G11C 7/12* (2013.01)

(58) Field of Classification Search
USPC ...................................... 716/118
See application file for complete search history.

(56) References Cited

U.S. PATENT DOCUMENTS

| | | | | |
|---|---|---|---|---|
| 6,470,475 B2* | 10/2002 | Dubey | ............... | G11C 11/419 |
| | | | | 716/121 |
| 8,185,851 B2* | 5/2012 | Kengeri | ............... | G06F 30/30 |
| | | | | 716/108 |

(Continued)

FOREIGN PATENT DOCUMENTS

WO    WO-2020182998 A1 *    9/2020    ........... G06F 30/392

OTHER PUBLICATIONS

Andersson, O. et al., Ultra Low Voltage Synthesizable Memories: A Trade-Off Discussion in 65 nm CMOS, "IEEE Transactions on Circuits and Systems_I:Regular Papers" 2016.

(Continued)

*Primary Examiner* — Mohammed Alam
(74) *Attorney, Agent, or Firm* — DINSMORE & SHOHL LLP

(57) ABSTRACT

A computer-implemented method for implementing integrated circuit with at least one RAM includes: defining memory portions of the RAM and obtaining memory portions; for each memory portion, generating a memory cell array block corresponding to the sizes of the memory portions, instances of the memory cell array blocks are inferred into a description of the integrated circuit in a hardware description language; for each block, generating timing and physical models; synthesizing description of circuit in the language, including peripheral logic for the blocks, to schematic representation of circuit elements; placing circuit elements, including blocks and peripheral logic, on circuit and routing wires between circuit elements taking into account the timing and physical models of blocks. An integrated circuit has memory portions of RAM, each having memory cell array block without, or partly without, peripheral logic; logic for each block implemented (Continued)

as standard cells, blocks and the logic distributed over circuit.

18 Claims, 8 Drawing Sheets

(51) Int. Cl.
*G06F 30/396* (2020.01)
*G11C 7/12* (2006.01)

(56) References Cited

U.S. PATENT DOCUMENTS

| | | | | |
|---|---|---|---|---|
| 8,607,019 | B2* | 12/2013 | Chung | G06F 30/30 |
| | | | | 711/2 |
| 9,811,628 | B1* | 11/2017 | Park | H01L 27/0207 |
| 2002/0013931 | A1* | 1/2002 | Cano | G06F 30/394 |
| | | | | 257/E23.153 |
| 2005/0114612 | A1* | 5/2005 | Bombal | G11C 29/003 |
| | | | | 711/154 |
| 2009/0172622 | A1* | 7/2009 | Pyapali | G06F 30/394 |
| | | | | 716/118 |
| 2018/0181684 | A1* | 6/2018 | Fredenburg | G06F 30/30 |
| 2019/0266477 | A1* | 8/2019 | Narcross | G06F 8/40 |
| 2022/0147683 | A1* | 5/2022 | Prabhu | G11C 7/12 |

OTHER PUBLICATIONS

Anonymous: Placement (electronic design automation)—Wikipedia, Sep. 25, 2018, Retrieved from the Internet: [retrieved on Sep. 4, 2019].

Sumbul, H.E. et al., A Synthesis Methodology for Application-Specific Logic-in-Memory Designs, 52nd ACM/EDAC/IEEE Design Automation Conference, Jun. 8, 2015, pp. 1-6.

* cited by examiner

PRIOR ART

METHOD FOR IMPLEMENTING AN INTEGRATED CIRCUIT COMPRISING A RANDOM-ACCESS MEMORY-IN-LOGIC

CROSS-REFERENCE TO RELATED APPLICATIONS

This application is the U.S. national stage of PCT/EP2020/056904 filed Mar. 13, 2020, which claims priority of European patent application 19162811.4 filed Mar. 14, 2019, both of which are hereby incorporated by reference in their entirety.

FIELD OF THE INVENTION

The invention relates to integrated circuits (IC), random-access memories (RAM) and, more specifically to a method for implementing and/or designing an integrated circuit comprising at least one random-access memory, to a method for integration of a random-access memory in an integrated circuit and to an integrated circuit designed by said methods.

BACKGROUND OF THE INVENTION

In many modern advanced System on Chip (SoC) designs there is a need for large memory subsystems (MSS) for various requirements. Many applications require very large memories in terms of number of storage elements. At the same time there are increasing and to some extent conflicting requirements on area, access time, and power consumption.

Existing RAM solutions usually try to pack bit cells in large bit cell arrays to minimize the area overhead due to RAM peripherals. This results in large RAM blocks. Although the blocks are area efficient the limited number of ports (single or dual port) can result in memory bandwidth issues. Also, these large RAM blocks cause routing and congestion issues.

Alternatively, it is possible to use standard cell based memories (SCM). This approach uses standard cells as storage elements instead of RAM bit cells, i.e. flip-flops or latches. The peripheral read and write access logic is implemented on a register transfer level (RTL) and also synthesized to standard cells. This offers a higher flexibility as the memory can be tuned to specific needs with considerably lower engineering effort than designing a full-custom RAM. Furthermore, since the memory is implemented using standard cells, it can be placed along with other logic in the circuit. However, standard cell memories have area penalty compared to bit cell based RAMs.

SUMMARY OF THE INVENTION

The present disclosure relates, in a first aspect, to a computer-implemented method for implementing or designing an integrated circuit comprising at least one random-access memory, the method comprising the steps of:
defining a plurality of memory portions of the random-access memory and obtaining sizes of the memory portions;
for each memory portion, generating a memory cell array block, the memory cell array blocks corresponding to the sizes of the memory portions, wherein instances of the memory cell array blocks are inferred into a description of the integrated circuit in a hardware description language wherein the memory cell array blocks are generated without peripheral logic;
for each memory cell array block, generating timing models and physical models;
synthesizing the description of the integrated circuit in the hardware description language, including peripheral logic for the memory cell array blocks, to a schematic representation of circuit elements;
placing the circuit elements, including the memory cell array blocks and the peripheral logic, on the integrated circuit and routing wires between the circuit elements taking into account the timing models and physical models of the memory cell array blocks, wherein all memory cell array blocks are synthesized and placed as separate blocks.

The presently disclosed method offers a way of combining the flexibility of SCMs and the area efficiency of conventional RAMs having packed and area optimized memory cells. Existing push rules can be used for the bit cells of the memory cell array blocks and by making the generated memory cell array blocks compatible with standard cells, the benefits of small area cost and flexibility of standard cell memories are provided. Preferably, the memory cell array blocks comprise tightly packed bit cells that are compatible with standard cells in the rest of the circuit. One of the advantages of the presently disclosed method is that relatively small memory blocks can be individually and separately distributed over the available surface of the integrated circuit. Since the random-access memory is divided into memory portions, routing congestion issues and bandwidth issues, which are typically bottlenecks of conventional memories, can be solved more easily than using a conventional memory design. The memory portions of the random-access memory may be distributed over the integrated circuit or over an area of the integrated circuit to optimize routing length and/or routing congestion and/or timing. Higher bandwidths and energy efficiency (pJ/access) in comparison to conventional memory design are achieved. At the same time, the described solution is more area-efficient than a standard cell memory. This combination may be particularly for applications such as like machine learning.

As mentioned, according to the presently disclosed method, a memory is obtained which is standard cell compatible and still has area efficiency of a conventional random-access memory. In a conventional random-access memory, the peripherals are typically custom made and manually designed. In the presently disclosed method the peripheral logic for the memory portions is preferable implemented using standard cells.

Since the memory cells of the memory portions of the presently disclosed implementation method may be area optimized, preferably by using push rule for this purpose in an automated design flow, they can typically not be placed directly on the core rails like standard cells. For this reason, the method may comprise a step of removing core rails under the memory cell array blocks and adding power routing around the memory cell array blocks. These steps may be performed automatically.

The present disclosure further relates to an integrated circuit, comprising:
a plurality of memory portions of a random-access memory, wherein each memory portion comprises a memory cell array block without, or partly without, peripheral logic;
peripheral logic for each of the memory cell array block implemented as standard cells, wherein the memory cell array blocks and the peripheral logic are distributed over the circuit.

The random-access memory of the integrated circuit may be any embodiment of the random-access memory described in the present disclosure. Both the memory cell array blocks and the peripheral logic may be distributed over the circuit. The integrated circuit may be a circuit implemented using the presently disclosed computer-implemented method for implementing or designing an integrated circuit comprising at least one random-access memory.

These and other aspects of the invention are set forth in the following detailed description of the invention.

DETAILED DESCRIPTION OF THE INVENTION

Figure 1:
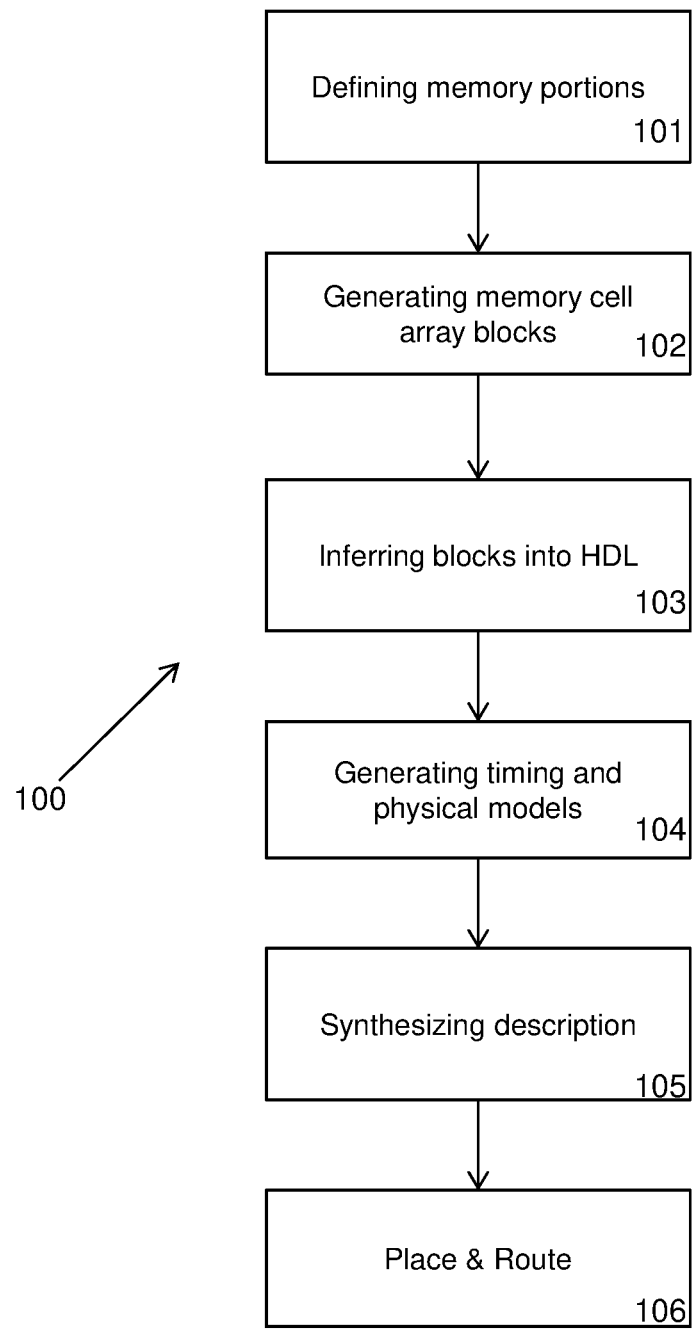
FIG. 1 shows an embodiment of the presently disclosed method for implementing an integrated circuit.

The present disclosure relates to computer-implemented method for implementing an integrated circuit comprising at least one random-access memory. The inventors have realized that by designing new memory-in-logic cells, i.e. memory cell array blocks comprising tightly packed bit cells, wherein the memory cell array blocks sizes correspond to the sizes of a number of memory portions, a more efficient integrated circuit in terms of performance and area can be achieved. By maintain the advantages of conventional memories (mainly area) and by making these blocks smaller and adapted to be integrated and placed among standard cell logic, a design can be obtained which is both area efficient and avoids, or at least improves, challenges and issues related to routing congestion. As a result, higher bandwidths and energy efficiency (pJ/access) for memory accesses can be obtained. Preferably, the method is an automated circuit design method.

In a first embodiment, the method comprises a step of defining a plurality of memory portions of the random-access memory and obtaining sizes of the memory portions. The sizes and partitioning of the memory may depend on a number of factors. The factors may for example be based on an expected use of different parts of the memories. The step of defining a plurality of memory portions of the random-access memory and obtaining sizes of the memory portions may also be based on an analysis, for example an automatic analysis of the hardware description (which could be for example VHDL, Verilog or any other suitable hardware description language). In one embodiment of the presently disclosed method, the memory portions of the random-access memory are automatically determined based on the description of the integrated circuit in a hardware description language. The determination could be based on analysis of for example an expected access frequency of certain parts of the memory. The method may further comprise the step of, for each memory portion, generating a memory cell array block, the memory cell array blocks corresponding to the sizes of the memory portions, wherein instances of the memory cell array blocks are inferred into a description of the integrated circuit in a hardware description language. The random-access memory may be divided into at least 3 memory portions, preferably at least 4 memory portions, more preferably at least 6 memory portions, even more preferably at least 10 memory portions. The higher number of memory instances, the greater flexibility in terms of placement. It can be noted that the memory cell array blocks will typically not be fully functional memories in the conventional sense since they will only have the packed storage elements with bit lines and word lines, and optionally parts of the peripheral logic, such as read/write drivers. The bit lines and word lines may thereby be considered to be part of the memory cell array blocks. The memory portions may have logical ports corresponding to the bit lines and word lines of the cell array blocks, as shown in FIG. 6C. The memory portions may comprise only the memory cells, including the word lines and bit lines, of the memory. Typically, scaling conventional RAMs to larger memory capacities will be beneficial for the area efficiency of the memory itself. For SCMs the opposite is typically true—larger memories have a larger area per stored bit. The presently disclosed integrated circuit having a plurality of memory portions of a random-access memory, and the method for implementing the same, benefit both from the fact that memory cells can be tightly packed and from the flexibility of the SCM.

Figure 9:
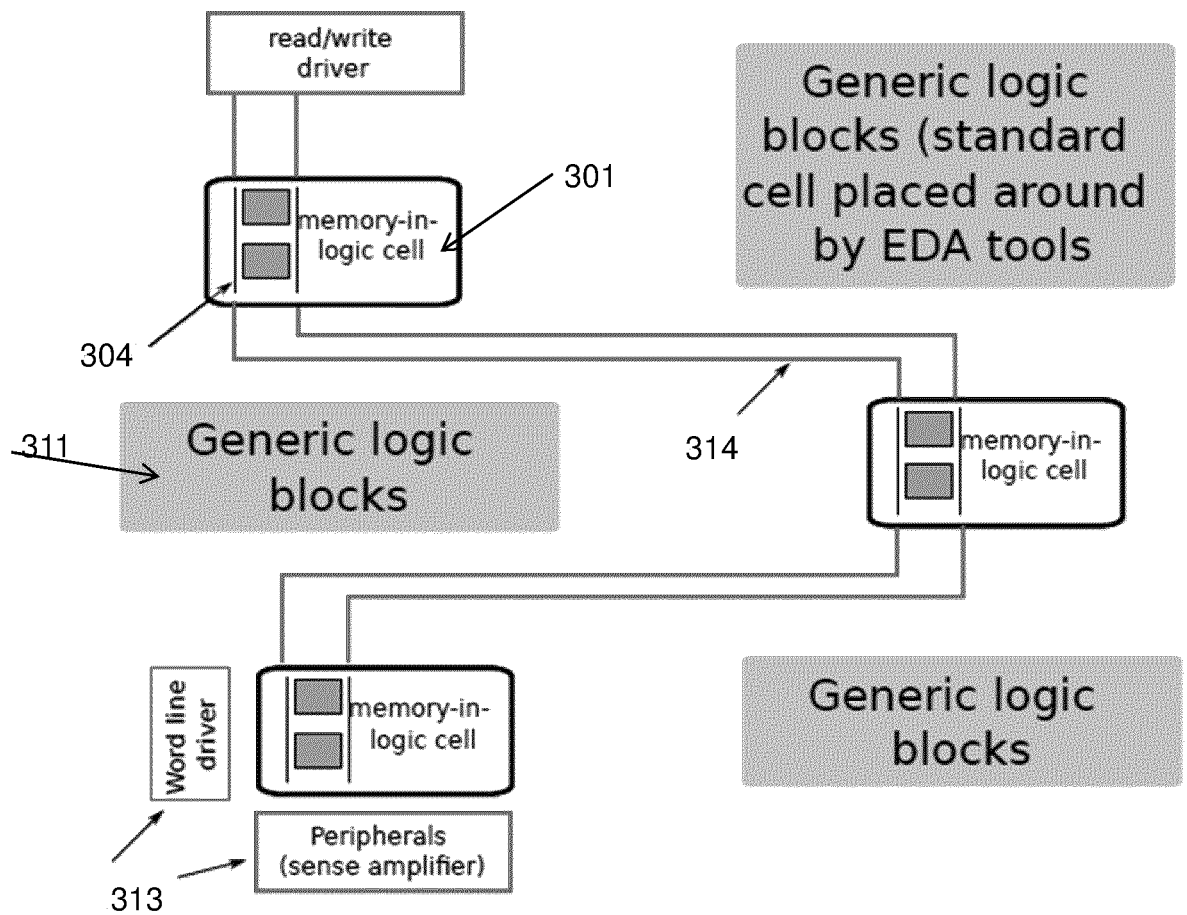
FIG. 9 shows multiple distributed instances of memory cell array blocks, wherein a part of the peripheral logic of the memory cell array blocks are shared, and wherein a global bit line is shared between the memory cell array blocks.

One of the advantages of the presently disclosed method is that relatively small memory blocks can be individually and separately distributed over the available surface of the integrated circuit. The memory cell array blocks do not have to be grouped but can be freely synthesized, placed and routed. In one embodiment of the presently disclosed method, each memory cell array block is enclosed by end cells at all edges of the memory cell array block. In the presence of the end cells, the memory cell array blocks can be separately placed and routed and fully embedded in surrounding standard cells. The end cells may be arranged in the lowest layer or the two lowest layers of the integrated circuit, which allows for routing to and from the bit cells in the higher layers. The layers may be metal layers. Dividing the memories into smaller separate segments of tightly packed bit cells may add a penalty to the peripheral logic, which is needed to make the memory cell array blocks functional, and which is typically added in the hardware description language. Therefore, in one embodiment, a first part of the peripheral logic is specific for each memory cell array block and a second part is common for a plurality or all of the memory cell array blocks. This may be specified in the hardware description language. Preferably, the memory blocks, as well as all peripheral logic, can still be individually and separately distributed. In a specific embodiment, a global bit line is shared and connected to a plurality or all of the memory cell array blocks. As shown in FIG. 9 the global bit line may be connected to all local bit lines of the cell array blocks. The global bit line can then be constrained to particular layers, such as metal layers, or, for example with respect to a bit line length and/or a bit line width, or be optimized to any physical parameter or requirement.

The method may further comprise a step of generating peripheral logic such that it is as part of the hardware description. Typically, for each memory cell array block, timing models and physical models are generated, which can be used in various steps, including syntheses, place and route, further optimization and layout, in an electronic design automation flow used to accomplish an integrated circuit. The method may comprise a step of synthesizing the description of the integrated circuit in the hardware description language, including peripheral logic for the memory cell array blocks, to a schematic representation of circuit elements. The schematic representation may in electronic design be referred to as a netlist, which comprises a list of electronic components, including standard cells from a given technology, and the list of nodes that they are connected to. Therefore, in one embodiment of the presently disclosed method, the schematic representation of circuit elements is a netlist of components and the nodes that they are connected to. The schematic representation of circuit elements may be technology specific and expressed in a specific standard cell library. The standard cells may have fixed-height corresponding to the distance between the core rails, and variable-width. The cells are typically optimized full-custom layouts, which minimize delays and area. Netlists can be provided in for example VHDL or Verilog. Netlists can be physical or logical, instance-based or net-based, and flat or hierarchical. The latter can be either folded or unfolded.

The method may further comprise the step of placing the circuit elements, including the memory cell array blocks and the peripheral logic, on the integrated circuit and routing wires between the circuit elements taking into account the timing models and physical models of the memory cell array blocks. The small but dense memory blocks can be distributed over the integrated area and the peripheral logic can be further distributed. In principle, the peripheral logic of the memory array blocks are related to both the memory array blocks and general logic and can therefore be optimized in relation to both in contrast to a conventional memory. It can be noted that the memory cell array blocks can be fully integrated into an automated circuit design method and can be handled as any component. In principle it is possible to work from an empty floor plan by adding only core rails. From the synthesized netlist, during the place and route, the general core logic, the memory cell array blocks and their peripherals can be almost freely placed on the floor plan in order to achieve a circuit that is as efficient as possible in terms of area, power and timing. Therefore, in one embodiment, the memory portions of the random-access memory are distributed over the integrated circuit or over an area of the integrated circuit to optimize routing length and/or routing congestion and/or timing. The placement and routing of an EDA tool typically comprise a number of iterations for stepwise improvements. In contrast to memories implemented as fixed custom cells, where the step of optimizing placement and routing is limited, the step of optimizing placement and routing of the presently disclosed method can optimize placement and routing of the peripheral logic in relation to the memory portions.

The random-access memory may be a static random-access memory (SRAM) or a dynamic random-access memory (DRAM). In SRAM, a bit of data is stored using for example a six transistor (6T) memory cell. This form of RAM is more expensive to produce, but is generally faster and requires less dynamic power than DRAM. A DRAM stores a bit of data using for example a transistor and capacitor pair, which together comprise a DRAM cell.

A typical conventional RAM may include data ports, address ports, a clock port, a select port, enable ports for read and write.

Figure 3:
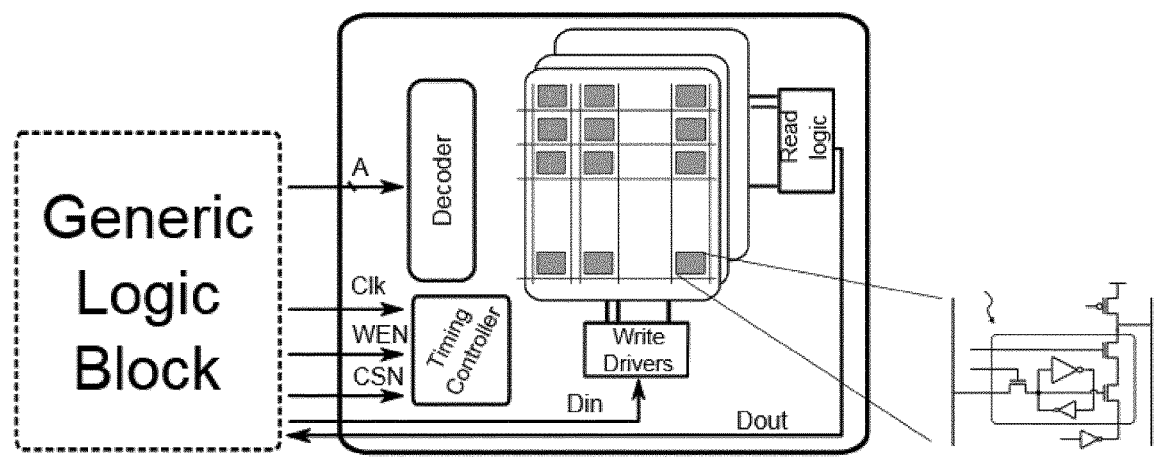
FIG. 3 shows the top-level architecture of a conventional memory with generic logic connected to ports.

FIG. 1 shows an embodiment of the presently disclosed method for implementing an integrated circuit. A typical EDA flow comprises steps for synthesis of a hardware description language, usually a register transfer level language, into a netlist. The components are then placed and routed on the chip. After further optimizations related to layout, clock tree etc. a final layout is obtained. The final chip layout is typically provided in the GDSII format. The presently disclosed method for implementing an integrated circuit comprising at least one random-access memory can be integrated to such an EDA flow, as illustrated in FIG. 1. The memory cell array blocks can be instantiated in the hardware description language at RTL level. SCMs are not limited by specific memory sizes and can be placed on the core rails for standard cells rows. This eases routing congestion and brings the memory closer to the logic. Thus, wire lengths and interconnect parasitics are reduced, which in turn lead to lower power and improved timing. In the present disclosure, the method for implementing an integrated circuit breaks with both this practice and using conventional memories, which are area efficient. According to one embodiment of the presently disclosed method for implementing an integrated circuit comprising at least one random-access memory, the generated memory cell array blocks are placed freely and can be handled as compatible with standard cells. The step of placing the circuit elements may further comprise the step of removing core rails under the memory cell array blocks. Preferably, the memory cell array blocks have power routing around the memory cell array blocks. Preferably, there is a GND ring and a VDD ring. In one embodiment the step of placing the circuit elements further comprises the steps of removing the core rails and connecting the power routing to the core rails. An example of this step is shown in FIG. 3.

Figure 2:
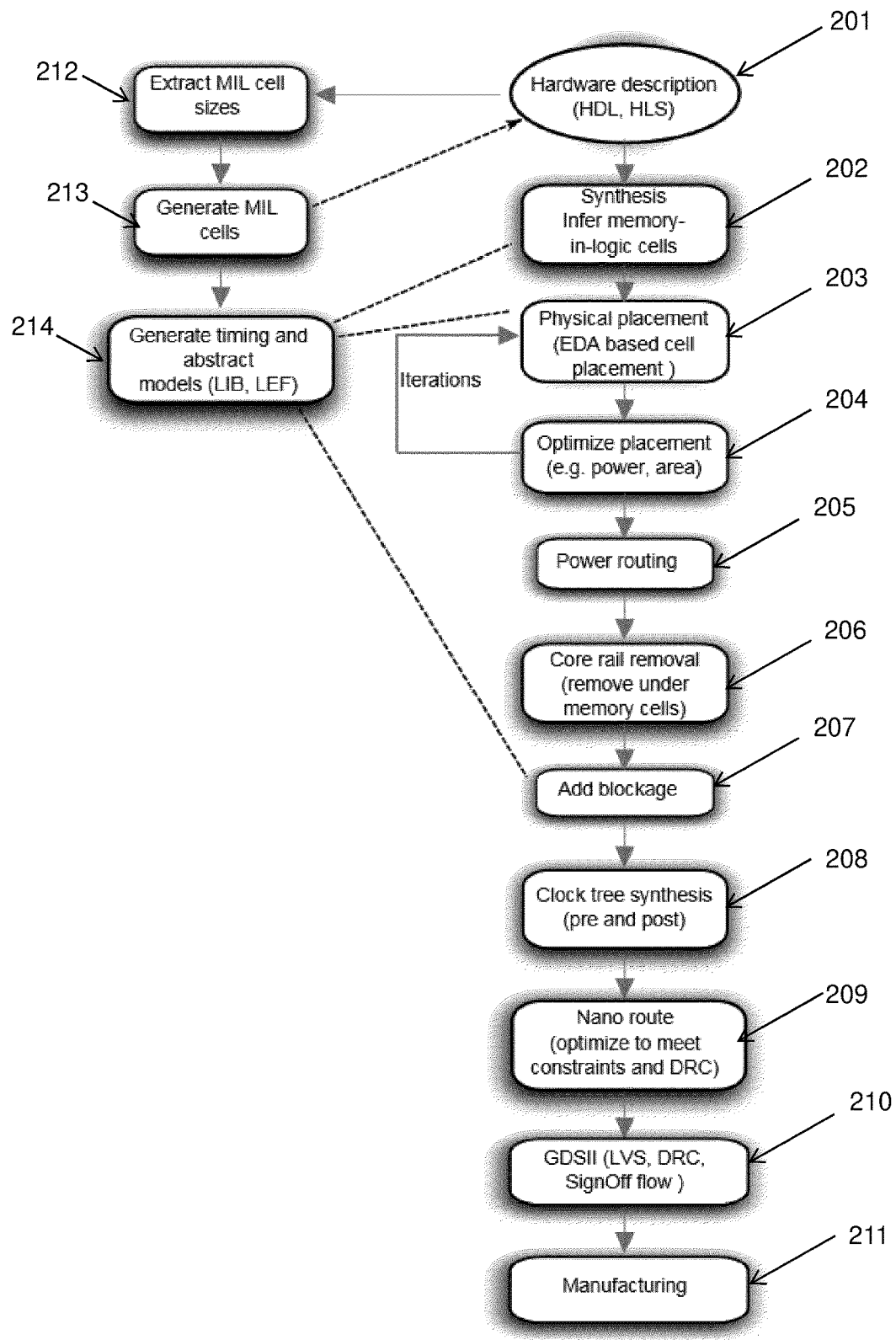
FIG. 2 shows an embodiment of the presently disclosed method being integrated in an electronic design automation (EDA) flow for implementing an integrated circuit.

As stated the memory cell array blocks may be generated completely without peripheral logic or partly without peripheral logic. For example, in some cases peripheral logic may be known to relate mainly to the bit cells and less to the general logic of the circuit. In such cases a first part of the peripheral logic can be part of the memory cell array blocks, while a second part is handled as general logic. The peripheral logic of the memory cell array blocks may be generated or inferred in the description of the integrated circuit in said hardware description language. In semiconductor design, standard cells are technology-specific logical entities representing abstract logic such as NAND gates. Standard cell libraries are required by EDA tools to design the circuit. Within the scope of the present disclosure all of the peripheral logic of the memory portions, or at least a part of the peripheral logic, may be implemented as standard cells using standard cell libraries. A first part of the peripheral logic may thereby be implemented as standard cells and a second part of the peripheral logic implemented as custom cell(s). The peripheral logic may comprise read and/or write decoders and/or sense amplifiers and/or control and/or timing logic and drivers and further logic, as shown in FIG. 2. Those skilled in the art of memories and integrated circuits will understand how the memory peripherals can be designed.

The memory cell is a fundamental building block of a memory. The memory cells store bits of binary information. As would be recognized by the person skilled in the art, the bit cells can be implemented in a number of ways, including for example four transistor (4T) SRAM memory cells, six transistor (6T) SRAM memory cells or eight transistor (8T) SRAM memory cells or DRAM memory cells. Any suitable memory cell can be used within the scope of the presently disclosed computer-implemented method for implementing an integrated circuit comprising at least one random-access memory. The cells can be based on any suitable technology for implementation of integrated circuits, for example Complementary metal-oxide-semiconductor (CMOS) and metal-oxide-semiconductor field-effect transistor (MOSFET). In one embodiment, the memory portions comprise a number of tightly packed memory cells, wherein each memory cell is made of MOSFETs, such as 6 MOSFETs forming two cross-coupled inverters.

The present disclosure further relates to use of the computer-implemented method for implementing an integrated circuit in an electronic design automation tool for designing an integrated circuit. The method can thereby be part of an EDA design flow.

The present disclosure further relates to an integrated circuit, comprising:
- a plurality of memory portions of a random-access memory, wherein each memory portion comprises a memory cell array block without, or partly without, peripheral logic;
- peripheral logic for each of the memory cell array block implemented as standard cells,
- wherein the memory cell array blocks and the peripheral logic are distributed over the circuit.

The integrated circuit may be an integrated circuit designed using any of the methods described above. In particular the memory cell array blocks may be placed among general core logic and the memory peripherals of the integrated circuit, wherein core rails are interrupted and removed under the memory cell array blocks, wherein the memory cell array blocks have power routing around the memory cell array blocks connected to the core rails. Moreover the memory cell array blocks of the integrated circuit may be optimized in area and whereas the placement and routing of the peripheral logic and the memory cell array blocks are optimized for any of routing length, routing congestion, timing, area or a combination.

DETAILED DESCRIPTION OF DRAWINGS

The invention will in the following be described in greater detail with reference to the accompanying drawings. The drawings are exemplary and are intended to illustrate some of the features of the presently disclosed computer-implemented method for implementing an integrated circuit, and are not to be construed as limiting to the presently disclosed invention.

FIG. 1 shows an embodiment of the presently disclosed method (100) for implementing an integrated circuit. The method comprises the step of defining suitable memory portions (101). Memory cell array blocks are then generated (102). The memory cell arrays blocks are then inferred into a description of the integrated circuit in a hardware description language (103), such as VHDL or Verilog, typically at register transfer level. The instances of memory cell array blocks may be instances representing the blocks without additional logic such as address decoders. Peripheral logic may be generated in parallel and inserted into the hardware description language. Preferably timing and physical models of the memory cell array blocks (104) are then generated. The timing and physical models can be used in several steps throughout the EDA flow. The peripheral logic will typically be implemented as standard cells based on a synthesis of the hardware description language. The method according to the example of FIG. 1 further comprises the steps of synthesizing the description of the integrated circuit in the hardware description language (105), including peripheral logic for the memory cell array blocks, to a schematic representation of circuit elements; and placing the circuit elements, including the memory cell array blocks and the peripheral logic, on the integrated circuit and routing wires between the circuit elements taking into account the timing models and physical models of the memory cell array blocks (106).

FIG. 2 shows an embodiment of the presently disclosed method being integrated in an electronic design automation (EDA) flow for implementing an integrated circuit. Memory cell array blocks are extracted from a hardware description language (201, 212). The generated cell array blocks are inferred into the hardware description language (213, 201). Preferably timing and physical models of the memory cell array blocks are then generated (214). The models may be used in for example the synthesis (202), place & route (203, 204). The step of placing components of the integrated circuit may include both standard cell placement, the memory cell array blocks and peripheral logic of the memories. The step of power routing (205) typically comprises the step of connecting power (VDD and GND) to instances of the components of the circuit. The core rails to the standard cells may typically be provided in METAL 1, which is the lowest layer. Since the memory cell array blocks are preferably area optimized, they may accordingly use the lowest metal layer. Therefore, preferably, the core rails under the memory cell array blocks are removed (206). Rings of VDD and GND may instead be placed around the memory cell array blocks and connected to the surrounding core rails. In addition, a blockage layer may be placed around the cell array memory blocks (207). The EDA flow may further comprise steps as simulations at different levels, including RTL and transistor level, clock tree synthesis (208) and various verification steps. When all verifications have passed the design can be signed-off (210), typically in a format such as GDSII, which means that is forwarded to manufacturing. The method for implementing an integrated circuit comprising may further comprise the step of manufacturing the integrated circuit (211).

FIG. 3 shows the top-level architecture of a conventional memory with generic logic connected to ports. Memories will typically comprise row and column decoders, precharge logic, timing control, read logic, sense amplifiers, write drivers etc.

Figure 4:
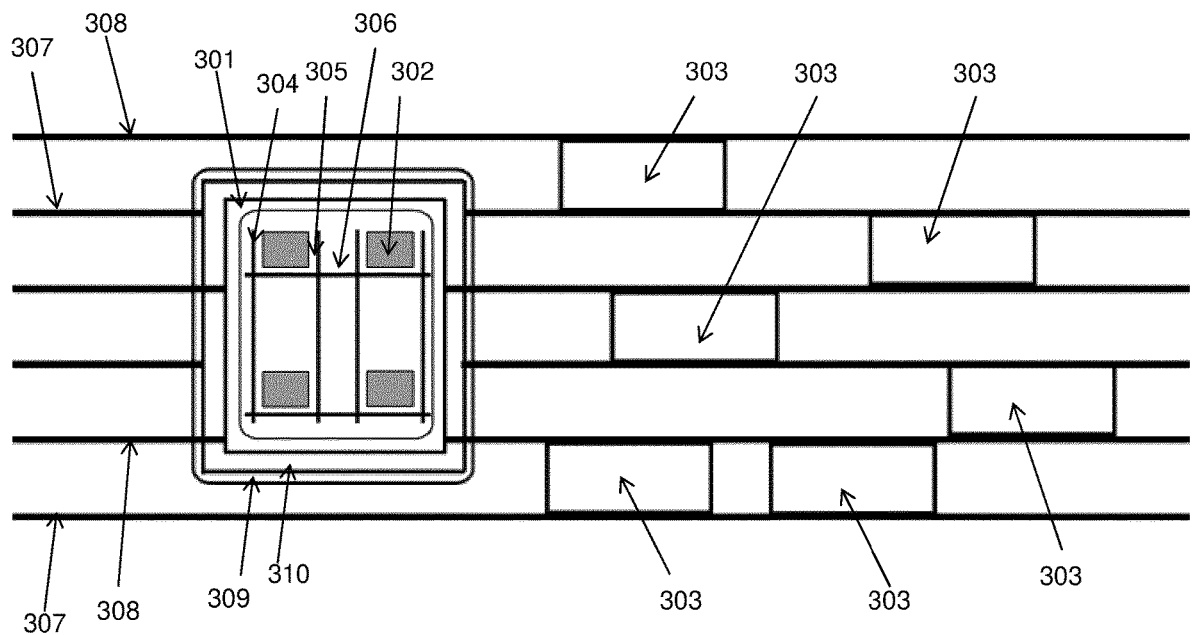
FIG. 4 shows an example of a memory portion having a memory cell array block which is placed next to standard cells.

FIG. 4 shows an example of a memory portion having a memory cell array block (301) which is placed next to standard cells (303). The memory cell array block (301) has a number of packed memory cells (302), word lines (306) bit lines and inverted bit lines (304, 305). The memory cell array block (301) has a VDD power ring (309) and a GND power ring (310). The VDD power ring (309) is attached to the VDD core rails (307) and the GND power ring (310) is attached to the GND core rails (308).

Figure 5:
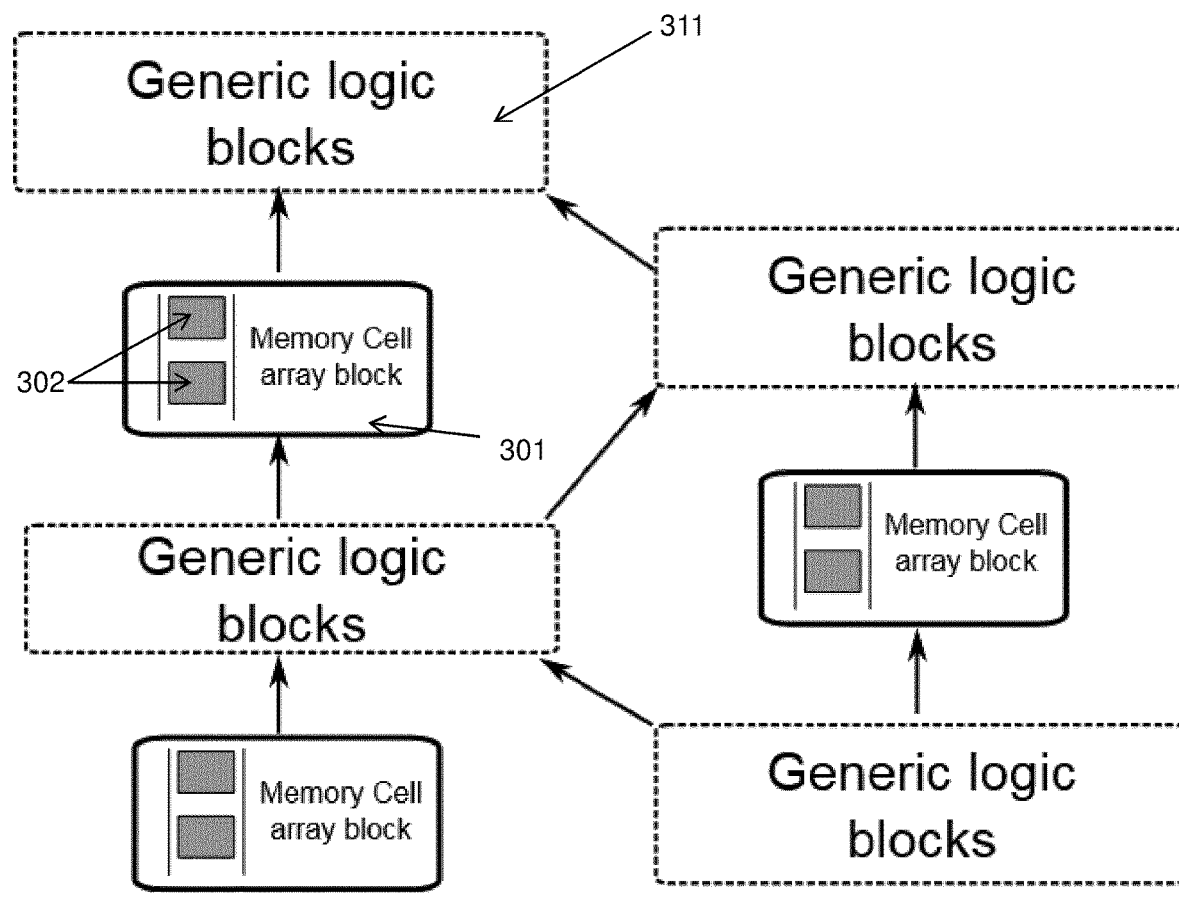
FIG. 5 shows how multiple instances of memory cell array blocks are distributed and integrated with standard cell logic.

FIG. 5 shows how multiple instances of memory cell array blocks (301) are distributed and integrated with standard cell generic logic (311). The memory cell array blocks (301) have a number of packed memory cells (302).

Figure 6A:
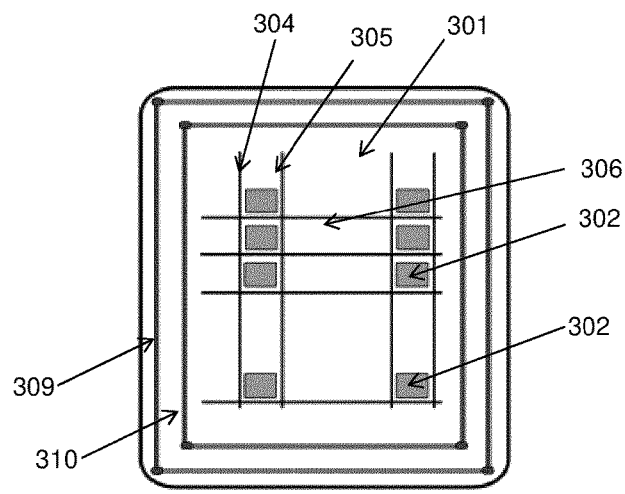
FIGS. 6A-C show additional aspects and views of the memory portions.
Figure 6C:
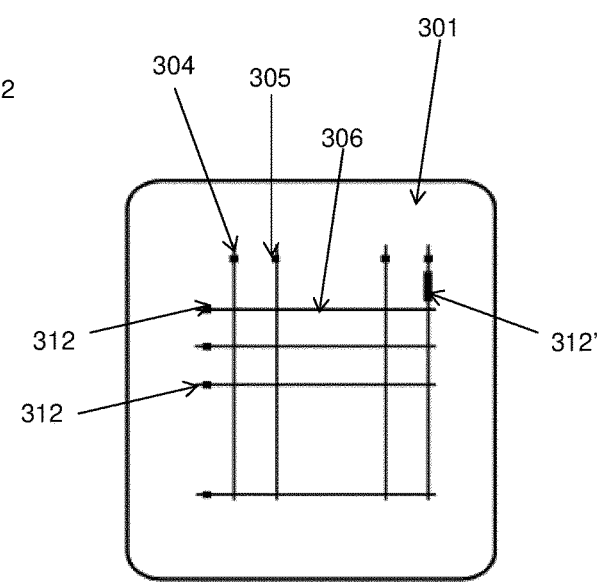
Figure 6B:
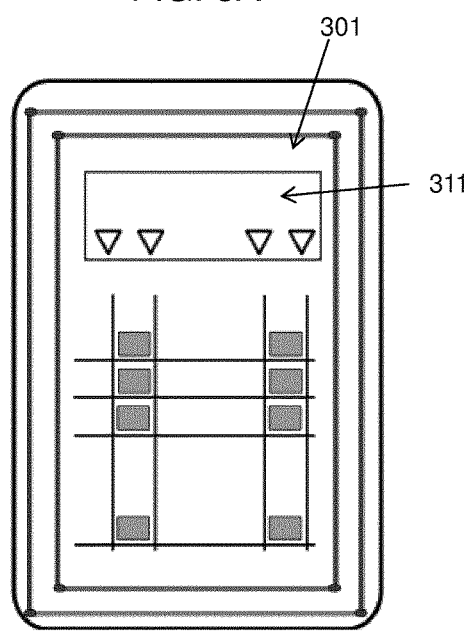

FIGS. 6A-C show additional aspects and views of the memory cell array blocks (301). FIG. 6A shows a physical view of a memory cell array block (301) without peripheral logic. The memory cell array block (301) has memory cells (302) arranged in rows and columns. Each row has an associated word line (306). In the example, each column has a bit line (BL, 304) and an inverted bit line (BLN, 305). Since there is no peripheral logic, the memory cell array block will typically not have a standard interface of a memory, which would typically include address ports, data ports, as well as a set of suitable read and write enable ports. The memory cell array blocks (301) may instead have ports directly connected to and representing the word lines and bit lines. FIG. 6C shows a logical view of a memory cell array block (301) having a number of logical pins (312, 312') for the word lines (306) and bit lines (304, 305). The logical pins may have different sizes. FIG. 6B shows memory cell array block (301) which includes read and write tri-state drives (311).

Figure 7:
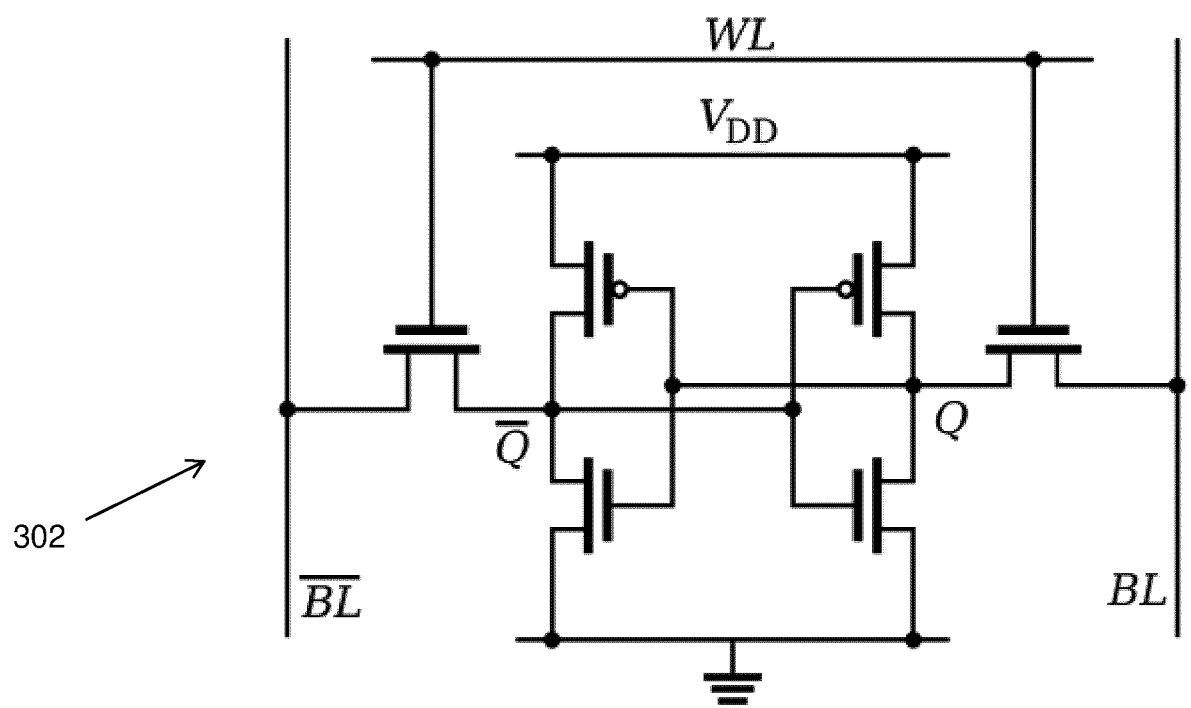
FIG. 7 shows an example of a memory cell.

FIG. 7 shows an example of a memory cell (302). The example is a standard six-transistor (6T) single port memory cell. Other memory cells are also possible to use within the scope of the presently disclosed integrated circuit and computer-implemented method for implementing or designing an integrated circuit, including 5T, 7T, 8T, 9T and 10T memory cell arrangements and any suitable number of ports.

Figure 8:
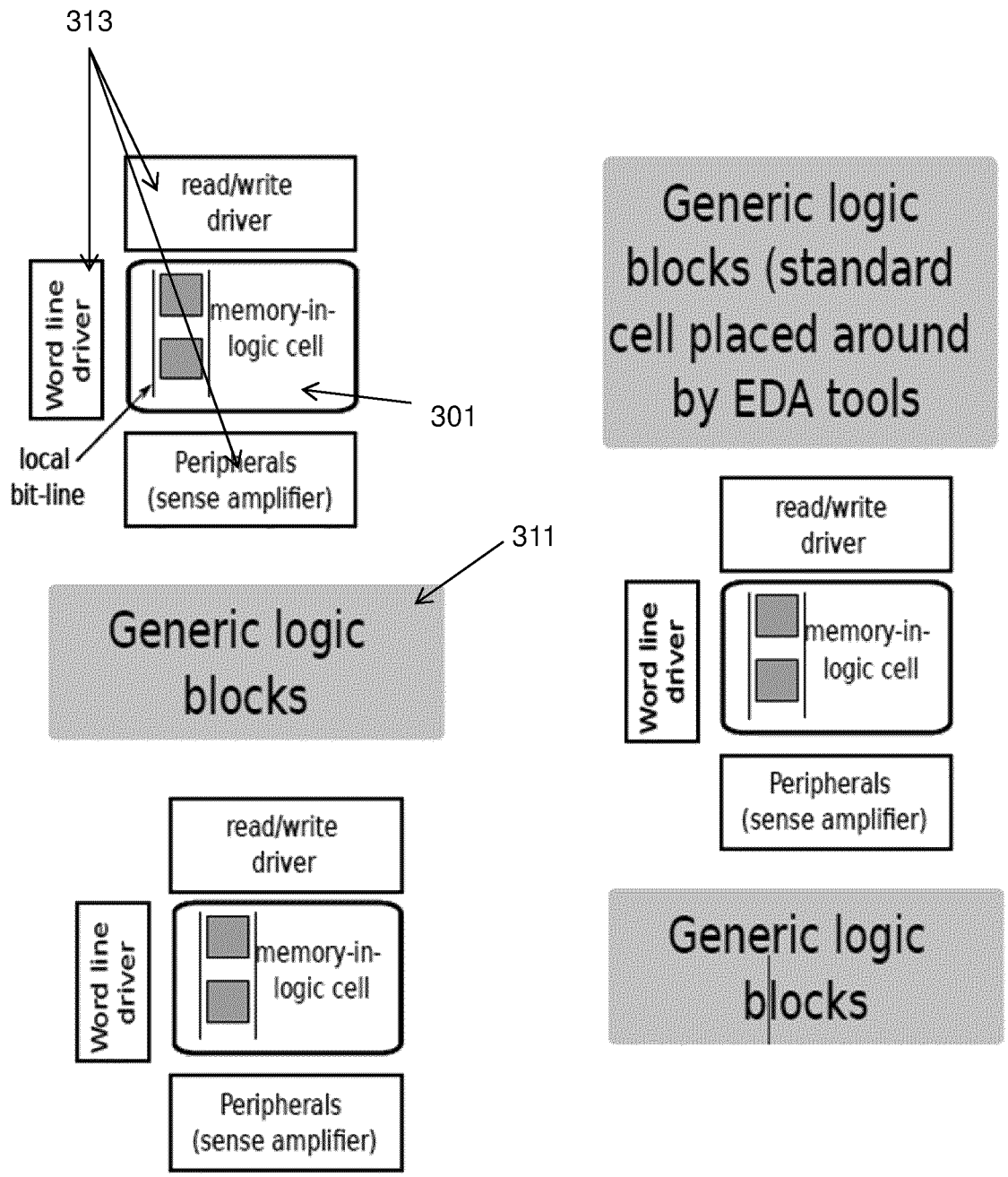
FIG. 8 shows multiple distributed instances of memory cell array blocks, wherein the peripheral logic of the memory cell array blocks are not included in the blocks, distributed and integrated with standard cell logic.

FIG. 8 shows multiple distributed instances of memory cell array blocks (301), wherein the peripheral logic (313) of the memory cell array blocks (301) are not included in the blocks but external parts of the memory cell array blocks (301) that can be freely synthesized and placed.

FIG. 9 shows multiple distributed instances of memory cell array blocks (301), wherein a part of the peripheral logic (313) of the memory cell array blocks (301) is shared, and, more specifically, wherein a global bit line (314) is shared between the memory cell array blocks (301). The global bit line (314) is connected to the local bit lines (304) of the memory cell array blocks (301).

FURTHER DETAILS OF THE INVENTION

1. A computer-implemented method for implementing or designing an integrated circuit comprising at least one random-access memory, the method comprising the steps of:
   defining a plurality of memory portions of the random-access memory and obtaining sizes of the memory portions;
   for each memory portion, generating a memory cell array block, the memory cell array blocks corresponding to the sizes of the memory portions, wherein instances of the memory cell array blocks are inferred into a description of the integrated circuit in a hardware description language;
   for each memory cell array block, generating timing models and physical models;
   synthesizing the description of the integrated circuit in the hardware description language, including peripheral logic for the memory cell array blocks, to a schematic representation of circuit elements; and
   placing the circuit elements, including the memory cell array blocks and the peripheral logic, on the integrated circuit and routing wires between the circuit elements taking into account the timing models and physical models of the memory cell array blocks.

2. The computer-implemented method for implementing an integrated circuit according to any of the preceding items, wherein the random-access memory is a static random-access memory or a dynamic random-access memory.

3. The computer-implemented method for implementing an integrated circuit according to any of the preceding items, wherein the memory cell array blocks are generated without peripheral logic or partly without peripheral logic.

4. The computer-implemented method for implementing an integrated circuit according to any of the preceding items, wherein the peripheral logic of the memory cell array blocks is generated or inferred in the description of the integrated circuit in said hardware description language.

5. The computer-implemented method for implementing an integrated circuit according to any of the preceding items, wherein the step of placing the circuit elements further comprises the step of removing core rails under the memory cell array blocks and adding power routing around the memory cell array blocks.

6. The computer-implemented method for implementing an integrated circuit according to item 5, wherein the steps of removing the core rails and adding power routing are performed automatically.

7. The computer-implemented method for implementing an integrated circuit according to any of items 5-6, further comprising the step of connecting the power routing to the core rails.

8. The computer-implemented method for implementing an integrated circuit according to any of the preceding items, wherein at least a part of the peripheral logic is implemented as standard cells from standard cell libraries.

9. The computer-implemented method for implementing an integrated circuit according to any of the preceding items, wherein a first part of the peripheral logic is implemented as standard cells and a second part of the peripheral logic is implemented as custom cell(s).

10. The computer-implemented method for implementing an integrated circuit according to any of the preceding items, wherein the random-access memory is divided into at least 3 memory portions, preferably at least 4 memory portions, more preferably at least 6 memory portions, even more preferably at least 10 memory portions.

11. The computer-implemented method for implementing an integrated circuit according to any of the preceding items, wherein the memory portions comprise a number of tightly packed memory cells, each memory cell made of MOSFETs, such as 6 MOSFETs forming two cross-coupled inverters.

12. The computer-implemented method for implementing an integrated circuit according to item 11, the memory cells further comprising bit lines and word lines.

13. The computer-implemented method for implementing an integrated circuit according to item 12, wherein the memory portions have logical ports corresponding to the bit lines and word lines.

14. The computer-implemented method for implementing an integrated circuit according to any of the preceding items, wherein the memory portions of the random-access memory are distributed over the integrated circuit or over an area of the integrated circuit to optimize routing length and/or routing congestion and/or timing.

15. The computer-implemented method for implementing an integrated circuit according to any of the preceding items, comprising the step of optimizing placement and routing of the peripheral logic in relation to the memory portions.

16. The computer-implemented method for implementing an integrated circuit according to item 15, wherein the step of optimizing placement and routing is performed by an electronic design automation tool.

17. The computer-implemented method for implementing an integrated circuit according to any of the preceding items, wherein the peripheral logic comprises read and/or write decoders and/or sense amplifiers and/or control and/or timing logic.

18. The computer-implemented method for implementing an integrated circuit according to any of the preceding items, wherein the memory portions comprise only the memory cells of the memory.

19. The computer-implemented method for implementing an integrated circuit according to any of the preceding items, wherein the hardware description language uses a register-transfer level model of a synchronous digital circuit.

20. The computer-implemented method for implementing an integrated circuit according to any of the preceding items, wherein the schematic representation of circuit elements is a netlist of components and the nodes that they are connected to.

21. The computer-implemented method for implementing an integrated circuit according to any of the preceding items, wherein the schematic representation of circuit elements is technology specific and expressed in a specific standard cell library.

22. The computer-implemented method for implementing an integrated circuit according to any of the preceding items, wherein the method is an automated circuit design method.

23. The computer-implemented method for implementing an integrated circuit according to any of the preceding items, wherein the memory portions of the random-access memory are automatically determined based on the description of the integrated circuit in a hardware description language.

24. The computer-implemented method for implementing an integrated circuit according to any of the preceding items, further comprising the step of performing verification steps, such as DRC, LVS, STA and/or formal verifications.

25. The computer-implemented method for implementing an integrated circuit according to any of the preceding items, further comprising the step of exporting a representation of the integrated circuit and manufacturing the integrated circuit.

26. Use of the computer-implemented method for implementing an integrated circuit according to any of the preceding items in an electronic design automation tool for designing an integrated circuit.

27. An integrated circuit, comprising:
a plurality of memory portions of a random-access memory, wherein each memory portion comprises a memory cell array block without, or partly without, peripheral logic;
peripheral logic for each of the memory cell array block implemented as standard cells,
wherein the memory cell array blocks and the peripheral logic are distributed over the circuit.

28. The integrated circuit according to item 27, wherein the memory cell array blocks are optimized in area and wherein placement and routing of the peripheral logic and the memory cell array blocks are optimized for any of routing length, routing congestion, timing, area or a combination.

29. The integrated circuit according to any of items 27-28, implemented using the method according to any of items 1-25.

The invention claimed is:

1. A computer-implemented method for implementing or designing an integrated circuit comprising at least one random-access memory, the method comprising the steps of:
defining a plurality of memory portions of the random-access memory and obtaining sizes of the memory portions;
for each memory portion, generating a memory cell array block, the memory cell array blocks corresponding to the sizes of the memory portions, wherein instances of the memory cell array blocks are inferred into a description of the integrated circuit in a hardware description language, wherein the memory cell array blocks are generated without peripheral logic;
for each memory cell array block, generating timing models and physical models;
synthesizing the description of the integrated circuit in the hardware description language, including peripheral logic for the memory cell array blocks, to a schematic representation of circuit elements; and
placing the circuit elements, including the memory cell array blocks and the peripheral logic, on the integrated circuit and routing wires between the circuit elements taking into account the timing models and physical models of the memory cell array blocks,
wherein all memory cell array blocks are synthesized and placed as separate blocks.

2. The computer-implemented method for implementing an integrated circuit according to claim 1, wherein each memory cell array block is enclosed by end cells at all edges of the memory cell array block.

3. The computer-implemented method for implementing an integrated circuit according to claim 2, wherein the end cells are arranged in a lowest layer or two lowest layers of the integrated circuit.

4. The computer-implemented method for implementing an integrated circuit according to claim 1, wherein the memory cell array blocks comprise tightly packed bit cells compatible with any standard cells.

5. The computer-implemented method for implementing an integrated circuit according to claim 1, wherein the peripheral logic of the memory cell array blocks is generated or inferred in the description of the integrated circuit in said hardware description language.

6. The computer-implemented method for implementing an integrated circuit according to claim 1, wherein a first part of the peripheral logic is specific for each memory cell array block and a second part is common for a plurality or all of the memory cell array blocks.

7. The computer-implemented method for implementing an integrated circuit according to claim 6, wherein a global bit line is connected to a plurality or all of the memory cell array blocks.

8. The computer-implemented method for implementing an integrated circuit according to claim 7, comprising the step of constraining the global bit line with respect to a bit line length and/or a bit line width.

9. The computer-implemented method for implementing an integrated circuit according to claim 7, comprising the step of routing the global bit line in a predetermined layer, such as a metal layer.

10. The computer-implemented method for implementing an integrated circuit according to claim 1, wherein the step of placing the circuit elements further comprises the step of removing core rails under the memory cell array blocks and adding power routing around the memory cell array blocks, preferably wherein the steps of removing the core rails and adding power routing are performed automatically.

11. The computer-implemented method for implementing an integrated circuit according to claim 1, wherein at least a part of the peripheral logic is implemented as standard cells from standard cell libraries.

12. The computer-implemented method for implementing an integrated circuit according to claim 1, wherein a first part of the peripheral logic is implemented as standard cells and a second part of the peripheral logic is implemented as custom cell(s).

13. The computer-implemented method for implementing an integrated circuit according to claim 1, wherein the random-access memory is divided into at least 3 memory portions, preferably at least 4 memory portions, more preferably at least 6 memory portions, even more preferably at least 10 memory portions.

14. The computer-implemented method for implementing an integrated circuit according to claim 1, wherein the memory portions of the random-access memory are distributed over the integrated circuit or over an area of the integrated circuit to optimize routing length and/or routing congestion and/or timing.

15. The computer-implemented method for implementing an integrated circuit according to claim 1, comprising the step of optimizing placement and routing of the peripheral logic in relation to the memory portions.

16. The computer-implemented method for implementing an integrated circuit according to claim 1, wherein the memory portions comprise only the memory cells of the memory.

17. The computer-implemented method for implementing an integrated circuit according to claim 1, wherein the memory portions of the random-access memory are automatically determined based on the description of the integrated circuit in a hardware description language.

18. Use of the computer-implemented method for implementing an integrated circuit according to claim 1 in an electronic design automation tool for designing an integrated circuit.

\* \* \* \* \*